United States Patent

Aihara

[11] Patent Number: 5,909,643
[45] Date of Patent: Jun. 1, 1999

[54] TRANSMITTER POWER VARYING DEVICE HAVING A BYPASS LINE FOR A POWER AMPLIFIER

[75] Inventor: Yuukichi Aihara, Kawasaki, Japan

[73] Assignee: Matsushita Electric Industrial Co., Ltd., Osaka, Japan

[21] Appl. No.: 08/722,856

[22] Filed: Sep. 26, 1996

[30] Foreign Application Priority Data

Nov. 24, 1995 [JP] Japan ................................. 7-306153

[51] Int. Cl.⁶ ........................................................ H04B 1/04
[52] U.S. Cl. ........................ 455/127; 455/343; 330/51
[58] Field of Search .................................. 455/127, 343, 455/91, 86, 116; 330/51

[56] References Cited

U.S. PATENT DOCUMENTS

| 5,152,004 | 9/1992 | Vaisanen et al. ............. 455/127 X |
| 5,530,923 | 6/1996 | Heinonen et al. ............ 330/51 X |
| 5,661,434 | 8/1997 | Brozovich et al. ............ 330/51 |
| 5,689,819 | 11/1997 | Nishimura et al. ............ 455/86 |

FOREIGN PATENT DOCUMENTS

| 4-130804 | 5/1992 | Japan . |
| 5-145349 | 6/1993 | Japan . |
| 6-85580  | 3/1994 | Japan . |

Primary Examiner—Wellington Chin
Assistant Examiner—Philip J. Sobutka
Attorney, Agent, or Firm—Pearne, Gordon, McCoy & Granger LLP

[57] ABSTRACT

A transmitter section of a mobile telephone set of a cellular telephone system includes a high-frequency signal oscillator, a modulator, a variable gain amplifier, a power amplifier, an antenna duplexer, and an antenna. Two high-frequency signal changeover switches are respectively provided upstream and downstream of the power amplifier. In transmitting a signal at a low output power, the power amplifier is turned off and the two changeover switches cause a high-frequency signal to go through a bypass line, that is, bypass the power amplifier. Thus, transmitter power control with a wide dynamic range can be attained while the power consumption is greatly reduced.

16 Claims, 10 Drawing Sheets

TRANSMITTER POWER VARYING DEVICE HAVING A BYPASS LINE FOR A POWER AMPLIFIER

BACKGROUND OF THE INVENTION

1. Field of the Invention

The present invention relates to a transmitter power varying device for varying the transmitter power over a wide dynamic range, and particularly relates to a transmitter power varying device for use in, for instance, a mobile telephone set of a cellular telephone system in which the power consumption is an important item to be addressed.

2. Description of the Related Art

In recent years, for more efficient reuse of frequency bands in cellular telephone systems, a mobile communications system according to the CDMA (code division multiple access) scheme using a spread spectrum technique is now entering a practice stage. In this system, to solve what is called a near-far problem, it is required to vary, quickly with high accuracy, the transmitter power over a range that is at least as wide as a little more than 70 dB. It has been reported that this system has an advantage that the average output power level is much smaller than conventional analog cellular telephone systems. On the other hand, since this system employs digital modulation, linear amplification needs to be performed. Therefore, the operating point is set in a region of a class-A amplifier which region assures superior linearity.

FIG. 12 shows an example of a conventional transmitter power varying device. An IF signal that is output from an IF signal oscillator 1 is modulated by an IF signal modulator 2 and then subjected to transmitter power varying control by an IF band variable gain amplifier 3. An output of the amplifier 3 is mixed, by an up-converter mixer 4, with a local frequency signal of a local signal oscillator 5. An output of the mixer 4 is amplified by a RF amplifier 6, then power-amplified by a power amplifier 7, and finally transmitted from an antenna 9 via an antenna duplexer 8. As such, in the transmitter power varying control of the conventional transmitter power varying device, the IF stage covers the entire variable range.

However, in the conventional transmitter power varying device, since the power amplifier performs a class-A (or class-AB) operation as described above, the consumption current cannot be reduced though the transmitter power can be made much smaller than in an analog-mode operation; that is, the above transmitter power varying device operates with very low power conversion efficiency. Further, since the conventional transmitter power varying device is required to cover a dynamic range of more than 80 dB, there remain difficult problems in connection with the characteristics of the variable gain amplifier, such as the linearity of the control characteristic, temperature dependence, distortion characteristic, noise characteristic, and consumption current characteristic.

SUMMARY OF THE INVENTION

The present invention has been made to solve the above problems in the art, and has an object of providing a transmitter power varying device which can improve the control characteristic and greatly reduce the power consumption while a transmitter is operating in a digital mode.

According to the invention, there is provided a transmitter power varying device comprising a variable gain amplifier for amplifying a transmission signal with a variable gain; a power amplifier for amplifying the transmission signal to produce an output signal which is to be transmitted from an antenna; a bypass line provided parallel with the power amplifier; and first and second high-frequency signal changeover switches respectively provided upstream and downstream of the power amplifier and the bypass line, for causing the transmission signal to go through the bypass line while bypassing the power amplifier in reducing a power of the output signal below a first threshold value, wherein the gain of the variable gain amplifier is increased to compensate for a gain reduction due to bypassing of the power amplifier. With this configuration, by virtue of the bypassing of the power amplifier, the control characteristic is improved and there can be prevented degradations in distortion due to digital modulation and in C/N ratio. In addition, the variable gain range of the variable gain amplifier can be reduced by the gain of the power amplifier, thus facilitating the designing of the variable gain amplifier.

The power amplifier may be made off while it is bypassed. With this configuration, the power consumption of the power amplifier, which conventionally amounts for 80–90% of that of the transmission system, can be reduced greatly. For example, the power consumption is greatly reduced during actual operation of a mobile telephone set.

The first and second high-frequency signal changeover switches may cause the transmission signal to go through the power amplifier in increasing the power of the output signal above a second threshold value that is larger than the first threshold value, to provide a hysteretic output control characteristic. This configuration is effective to prevent switching from occurring too frequently around the threshold value as well as to prevent chattering.

An isolator or a resistive attenuator may be provided in the bypass line. This is effective to prevent feedback-loop oscillation that might otherwise occur when the isolation of the high-frequency signal changeover switches is insufficient.

A circulator may be connected to the output side of the isolator and to the output side of the power amplifier via the second high-frequency signal changeover switch, wherein the second high-frequency signal changeover switch is so constructed as to selectively connect the output side of the isolator to the output side of the power amplifier or a ground side via the circulator. In this case, reflection waves that may occur due to mismatching of the antenna always reach the output side of the isolator via the circulator and do not return to the power amplifier. Therefore, the circuit is less affected by a load variation and can be constructed at a lower cost.

The invention can be applied to any of a case of using a RF-stage variable gain amplifier with carrier direct modulation, a case of using an IF-stage variable gain amplifier with IF-stage modulation, and a case of using both of an IF-stage and RF-stage variable gain amplifiers with IF-stage modulation. The above advantages can be obtained in each case.

DESCRIPTION OF THE PREFERRED EMBODIMENTS

Embodiments of the present invention will be hereinafter described with reference to the accompanying drawings.

Embodiment 1

Figure 1:
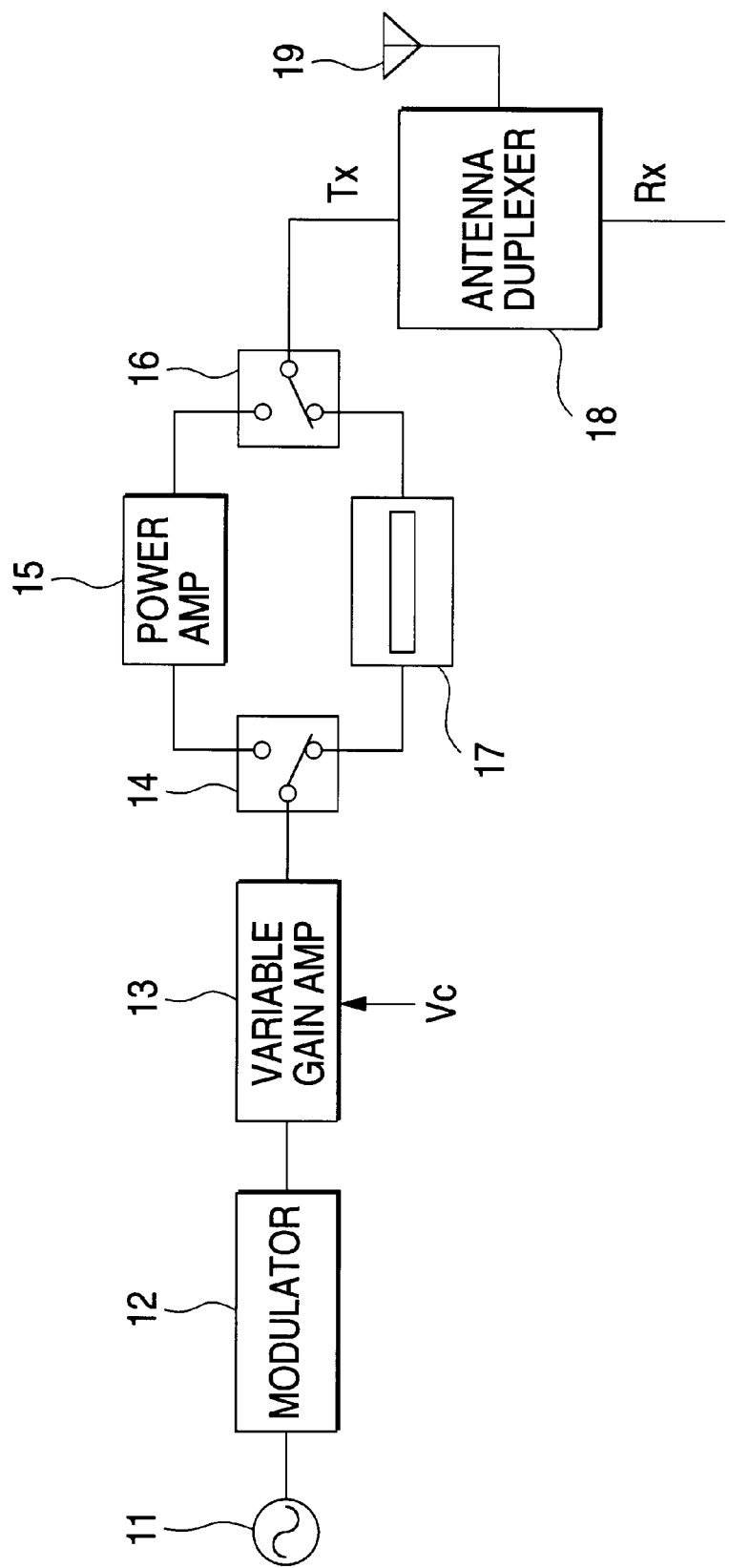
FIG. 1 is a block diagram showing a general configuration of a transmitter power varying device according to a first embodiment of the present invention.

FIG. 1 shows a general configuration of a transmitter power varying device according to a first embodiment of the invention. This transmitter power varying device is incorporated in a transmitter section of a mobile telephone set of a cellular telephone system. In FIG. 1, reference numeral 11 denotes a high-frequency signal oscillator for generating a signal to be transmitted; 12, a modulator for modulating the transmission signal into a signal suitable for radio communication; 13, a variable gain amplifier for controlling, i.e., varying the gain of the transmission signal; 15, a power amplifier for amplifying the transmission signal; 14, a front-stage high-frequency signal changeover switch for supplying the transmission signal to the power amplifier 15 or causing it to bypass the power amplifier 15 by using predetermined threshold values as references; 16, a rear-stage high-frequency signal changeover switch that operates in link with the changeover switch 14; 17, a bypass line that is connected to the front-stage and rear-stage high-frequency signal changeover switches 14 and 16; 18, an antenna duplexer for switching between an outgoing transmission signal and an incoming reception signal; and 19, an antenna. The above components are controlled by a CPU control section (not shown). The bypass line 17 is generally an impedance-matched line. It is usually a shielded line having a characteristic impedance of 50 Ω, and specifically a coaxial feeder line or strip line of 50 Ω.

Figure 2:
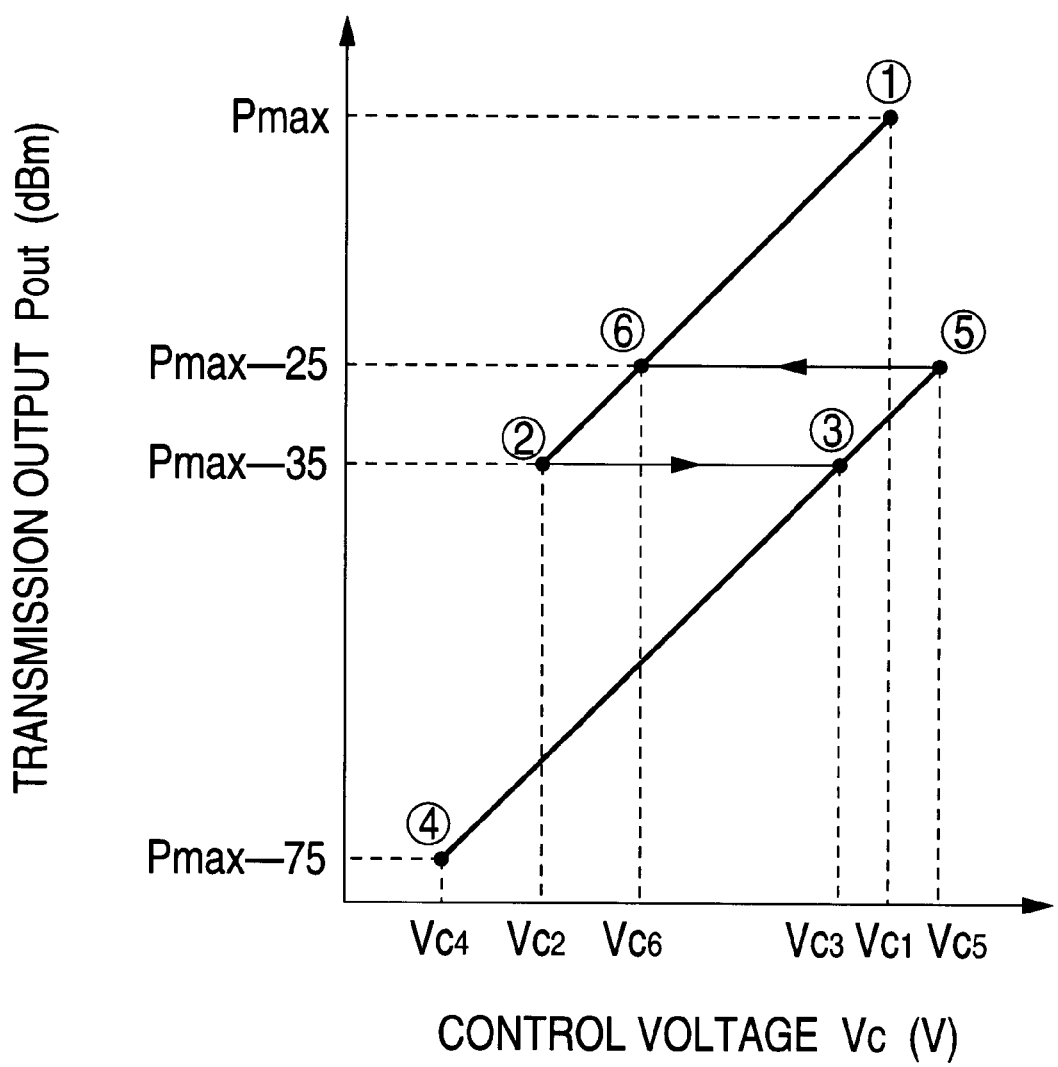
FIG. 2 is a graph showing a relationship between a control voltage Vc and a transmitter power Pout.

The operation of this embodiment will be described below. FIG. 2 shows a relationship between a control voltage $V_c$ of the variable gain amplifier 13 and a transmitter power $P_{out}$. Symbol $P_{max}$ represents the maximum output of the mobile telephone set. If a first output value (subjected to open-loop control) falls within a range of $P_{max}$ to $P_{max}-35$ dBm, connection is made to the power amplifier 15 side in the high-frequency signal changeover switches 14 and 16 and the power amplifier 15 is turned on. When the transmitter power $P_{out}$ becomes smaller than $P_{max}-35$ dBm as a result of transmitter power reducing control in the mobile telephone set in response to an instruction from a base station (closed-loop control), connection is made to the bypass line 17 side in the high-frequency signal changeover switches 14 and 16 and the power amplifier 15 is turned off (i.e., power thereto is shut off). In the course of the above operation, the transmitter power $P_{out}$ decreases as the operating point moves from point (1) to (2), then jumps to point (3), and thereafter moves to point (4). The control voltage $V_C$ temporarily increases from $V_{c2}$ to $V_{c3}$ when the operating point jumps from point (2) to (3), and decreases thereafter.

When the transmitter power $P_{out}$ is increased from a low-output state (($P_{max}-35$ dBm) to ($P_{max}-75$ dBm)), in the high-frequency signal changeover switches 14 and 16 the connection to the bypass line 17 side is kept until $P_{out}$ reaches $P_{max}-25$ dBm and the power amplifier 15 is kept off. When the transmitter power $P_{out}$ exceeds $P_{max}-25$ dBm, the high-frequency signal changeover switches 14 and 16 are switched to the power amplifier 15 side and the power amplifier 15 is turned on. At the same time, the control voltage $V_c$ decreases from $V_{c5}$ to $V_{c6}$. As described above, the threshold value for a variation from point (4) to (5) where the transmitter power $P_{out}$ increases and that for a variation from point (1) to (2) where the transmitter power $P_{out}$ decreases are different from each other by 10 dB. This is to prevent switching from occurring too frequently around the threshold value as well as to prevent chattering.

The cellular telephone system standard provides that the interval of the output power level switching be not shorter than 1.25 ms, whereas the switching time of the high-frequency signal changeover switches 14 and 16 is less than about 10 μs, the control response time of the variable gain amplifier 13 is less than about 20 μs, and the response time of the power amplifier 15 is less than about 30 μs. Therefore, no abnormal transient responses will occur.

Still referring to FIG. 2, the jump from point (2) to (3) or from (5) to (6) corresponds to a gain variation of the variable gain amplifier 13 which is equal to the gain of the power amplifier 15. Therefore, the variable gain range of the variable gain amplifier 13 can be reduced by the gain of the power amplifier 15, thus facilitating the designing of the variable gain amplifier 13.

As described above, in the first embodiment, the high-frequency signal changeover switches 14 and 16 are provided upstream and downstream of the power amplifier 15. In performing control of reducing the transmitter power below the predetermined threshold value, the high-frequency signal changeover switches 14 and 16 are connected to the bypass line 17 side to bypass the power amplifier 15 and the power amplifier is turned off (i.e., power thereto is shut off). As a result, the consumption current can be reduced greatly. Further, the bypassing of the power amplifier 15 can prevent deteriorations in distortion of digital modulation and in C/N ratio.

Embodiment 2

Figure 3:
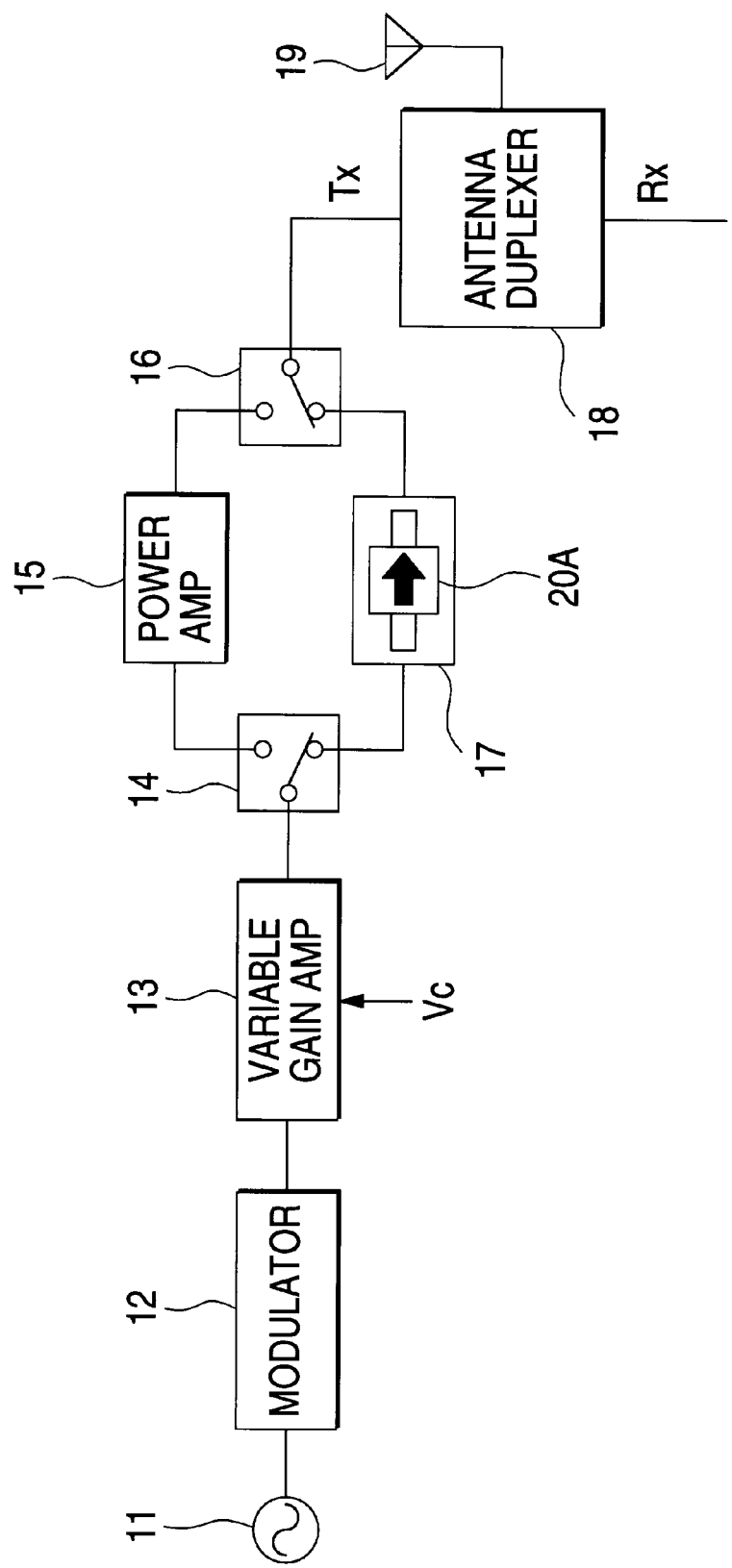
FIG. 3 is a block diagram showing a general configuration of a transmitter power varying device according to a second embodiment of the invention.

A second embodiment of the invention will be described with reference to FIG. 3. This embodiment is different from the first embodiment in that an irreversible isolator 20A is provided somewhere in the length of the bypass line 17. By virtue of the existence of the irreversible isolator 20A, there can be prevented a phenomenon that when the high-frequency-band isolation performance of the high-frequency signal changeover switches 14 and 16 is insufficient, an output of the power amplifier 15 in an on-state leaks out at the rear-stage high-frequency signal changeover switch 16, reversely goes through the bypass line 17, again leaks out at the front-stage high-frequency signal changeover switch 14, and finally returns to the power amplifier 15, to cause feedback-loop oscillation.

Embodiment 3

Figure 4:
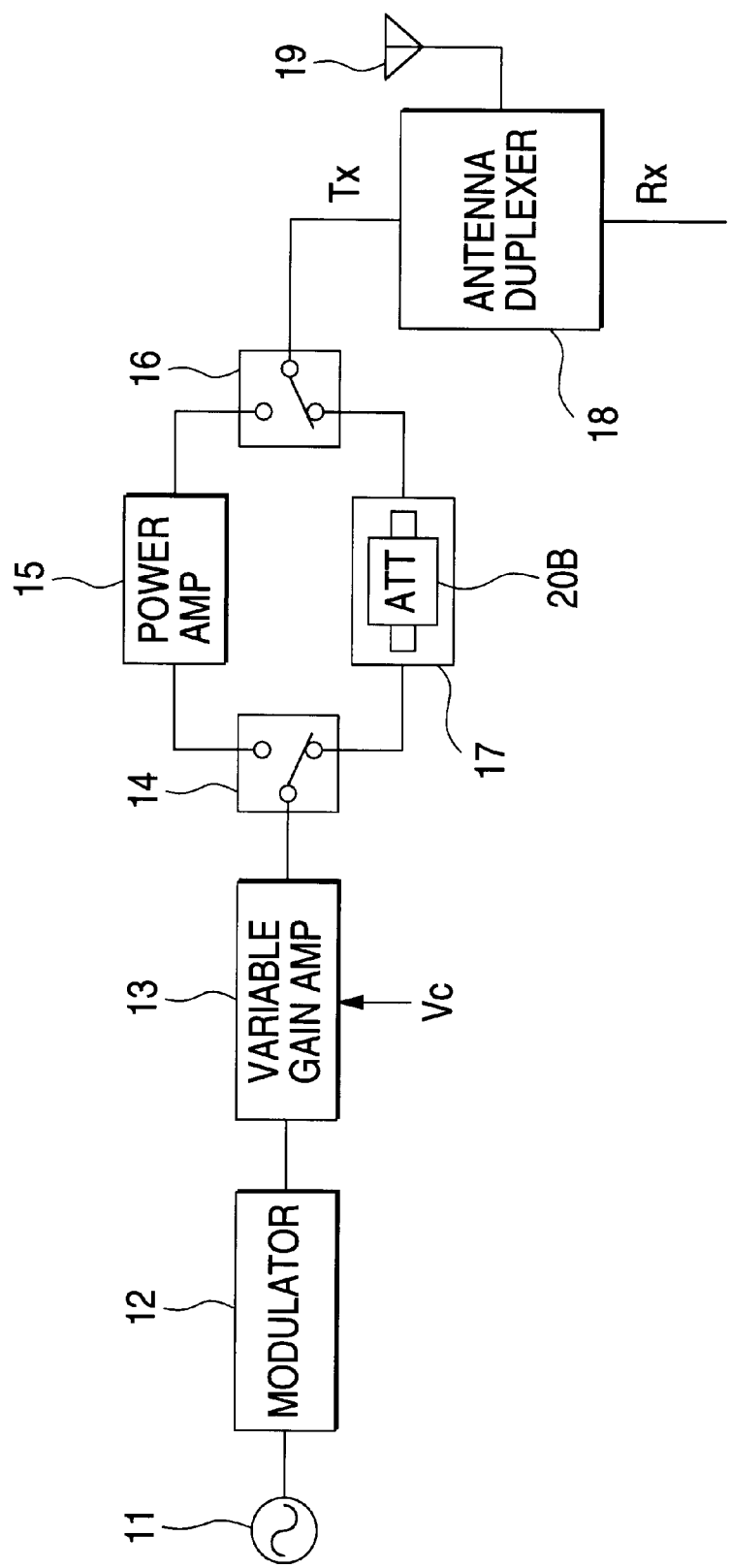
FIG. 4 is a block diagram showing a general configuration of a transmitter power varying device according to a third embodiment of the invention.

As shown in FIG. 4, a third embodiment of the invention is characterized by an attenuator (resistive attenuator) 20B that is provided somewhere in the length of the bypass line 17. As in the case of the second embodiment, this embodiment is intended to prevent the feedback-loop oscillation. However, in this embodiment, the variation in control voltage $V_c$ corresponding to the jump from point (2) to (3) or from point (5) to (6) (see FIG. 2) includes an amount corresponding to the attenuation. In the second embodiment, although there can be obtained a sufficient margin for the feedback-loop oscillation, the cost of parts used is high and there is a possibility of out-of-band oscillation. In contrast, in this embodiment, although a stable operation is ensured over a wide range and the cost is low, there occurs a large jump in varying the gain of the variable gain amplifier 13.

Embodiment 4

Figure 5:
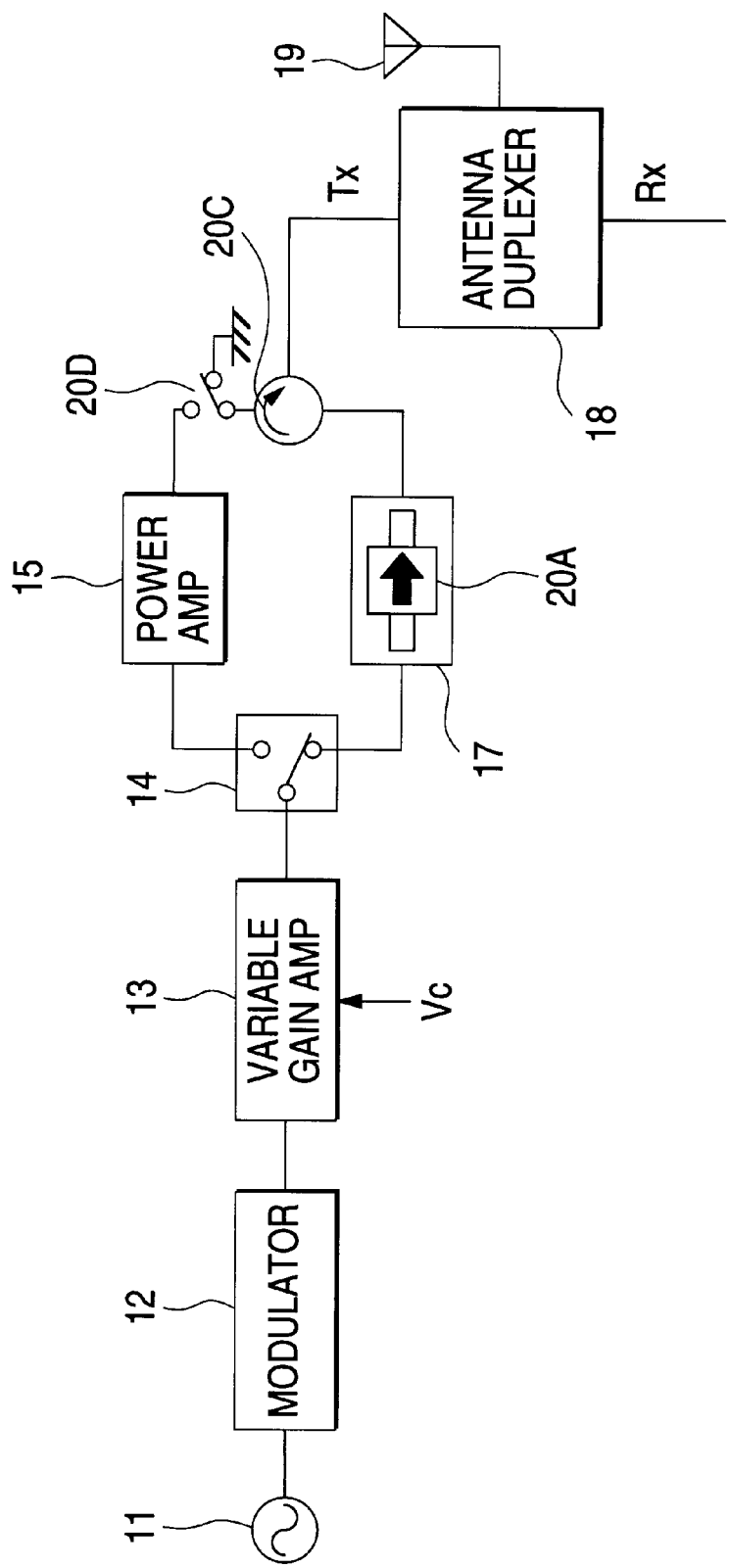
FIG. 5 is a block diagram showing a general configuration of a transmitter power varying device according to a fourth embodiment of the invention.

As shown in FIG. 5, a fourth embodiment of the invention is characterized in that an isolator 20A is provided somewhere in the length of the bypass line 17, and that the output of the isolator 20A is connected to a circulator 20C while the output of the power amplifier 15 is also connected to the circulator 20C via a rear-stage high-frequency signal changeover switch 20D. One terminal of the circulator 20C is connected to the antenna duplexer 18. The high-frequency signal changeover switch 20D is constructed such that the movable contact is connected to the circulator 20C while the two fixed contacts are connected to the power amplifier 15 and the ground, respectively. Thus, the terminal of the circulator 20C can selectively be connected to the power amplifier 15 or the ground. It is assumed that the circulator 20C rotates clockwise as shown in FIG. 5.

When the power amplifier 15 is in an on-state, the high-frequency signal changeover switch 20D is switched to the power amplifier 15 side to connect it to the circulator 20C, whereby a transmission signal is introduced from the power amplifier 15 to the antenna duplexer 18. When a transmission signal is to go through the bypass line 17, the high-frequency signal changeover switch 20D is switched to the ground side, whereby the circulator 20C is grounded. As a result, a transmission signal that has passed through the isolator 20A goes through the circulator 20C, and is then reflected by the ground. The transmission signal is then introduced to the antenna duplexer 18 via the circulator 20C.

As described above, in this embodiment, the bypass line 17 is provided with the isolator 20A, and the output side of the isolator 20A is connected to the circulator 20C. One terminal of the circulator 20C is connected to the antenna side, and the rear-stage high-frequency signal changeover switch 20D is so constructed that the circulator 20C can selectively be connected to the power amplifier 15 or the ground. Therefore, even if reflection waves occur due to a variation in load impedance, the circulator 20C prevents those waves from returning to the power amplifier 15; that is, those waves are directed to the isolator 20A and consumed there. Therefore, the circuit of this embodiment is less affected by a load variation. In addition, since the rear-stage high-frequency signal changeover switch 20D may be of a type that is lower in isolation performance than the high-frequency signal changeover switch 16 of the above embodiments, the circuit cost can be reduced.

Embodiment 5

Figure 6:
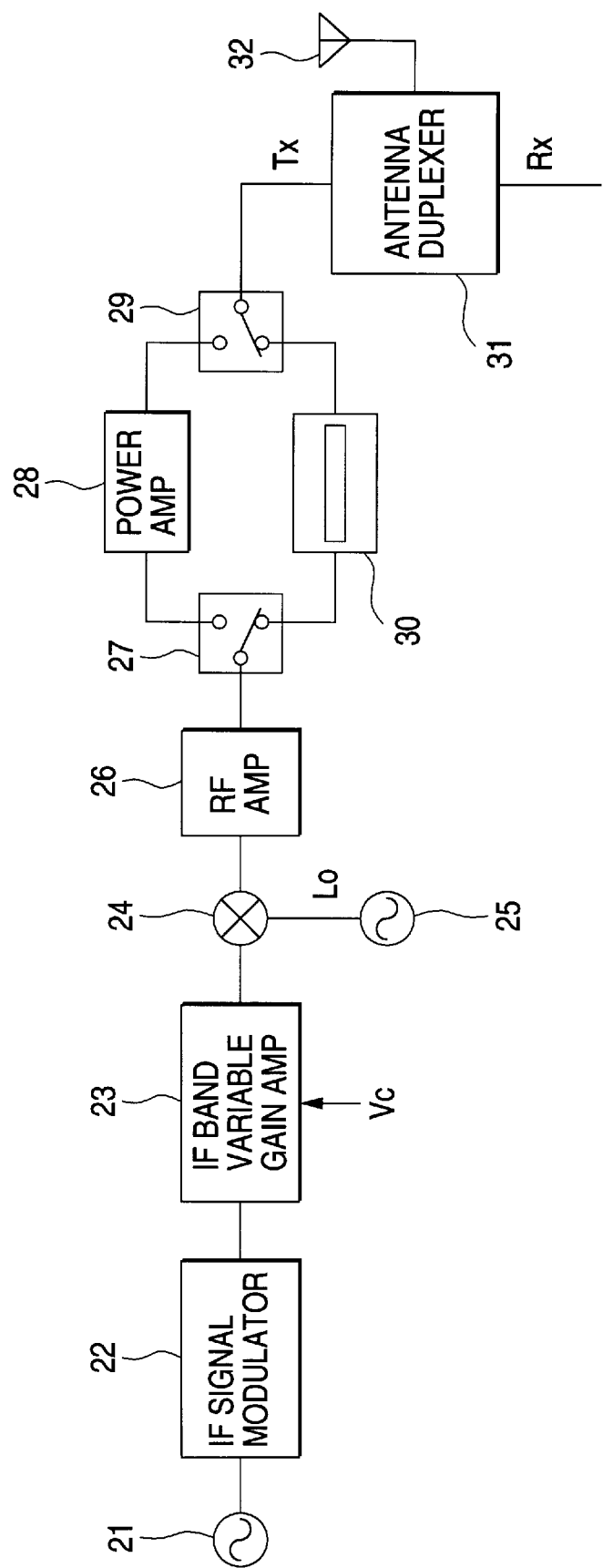
FIG. 6 is a block diagram showing a general configuration of a transmitter power varying device according to a fifth embodiment of the invention.

FIG. 6 shows a general configuration of a transmitter power varying device according to a fifth embodiment of the invention. In FIG. 6, reference numeral 21 denotes an IF signal oscillator for generating a signal to be transmitted; 22, an IF signal modulator; 23, an IF band variable gain amplifier; 24, an up-converter mixer; 25, a local signal oscillator; 26, a RF amplifier; 27, a front-stage high-frequency signal changeover switch; 28, a power amplifier; 29, a rear-stage high-frequency signal changeover switch; 30, a bypass line; 31, an antenna duplexer; and 32, an antenna. The above components are controlled by a CPU control section (not shown).

The transmitter power varying device of this embodiment operates basically in the same manner as the devices of the first to third embodiments, and operates differently from those devices in the following points. An IF signal that is output from the IF signal oscillator 21 is modulated by the IF signal modulator 22, and then subjected to transmitter power varying control by the IF band variable gain amplifier 23. An output of the amplifier 23 is mixed with a local frequency signal of the local signal oscillator 25 by the up-converter mixer 24. An output of the mixer 24 is amplified by the RF amplifier 26. This embodiment provides an advantage that the variable gain amplifier can be implemented as an IC more easily than in the above embodiments.

Embodiment 6

Figure 7:
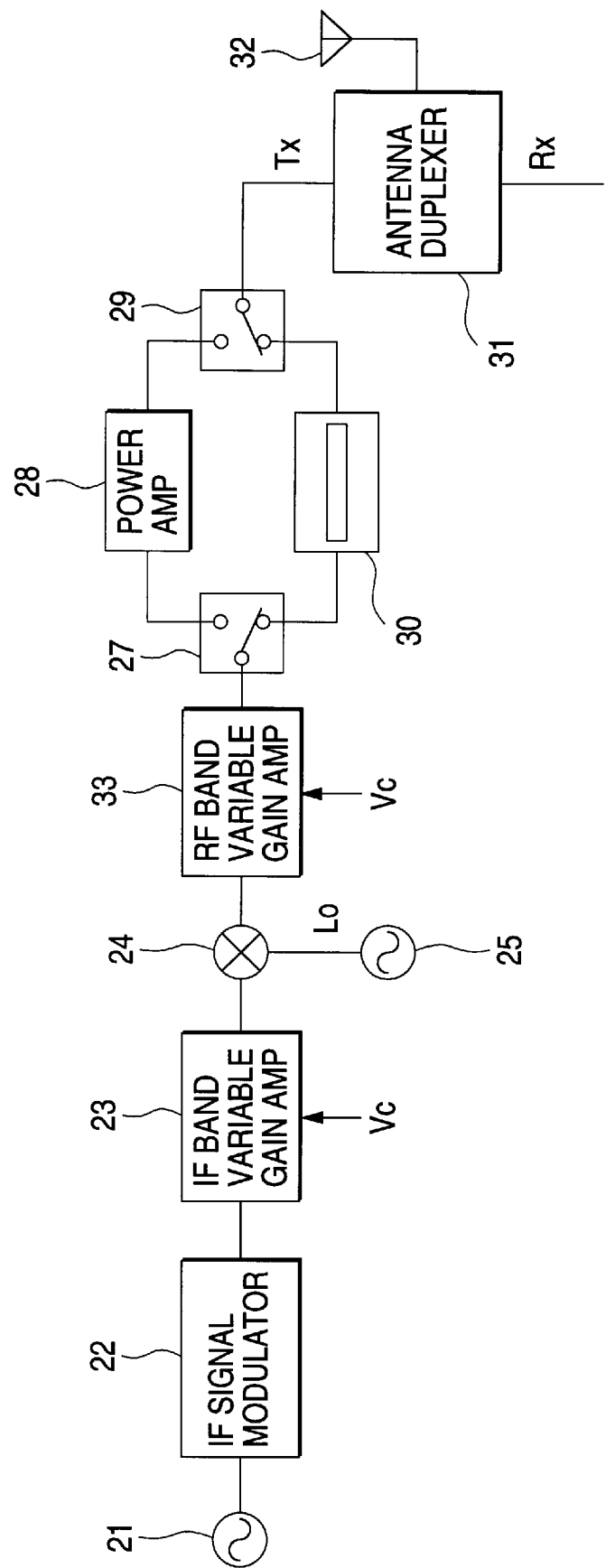
FIG. 7 is a block diagram showing a general configuration of a transmitter power varying device according to a sixth embodiment of the invention.

FIG. 7 shows a general configuration of a transmitter power varying device according to a sixth embodiment of the invention. This embodiment is different from the fifth embodiment in that the RF amplifier 26 is replaced by a RF band variable gain amplifier 33. Because the variable gain amplifier is divided into the IF stage and the RF stage, this embodiment provides advantages that the up-converter mixer 24 can be implemented as an IC more easily and that a large C/N ratio can be obtained.

Embodiment 7

Figure 8:
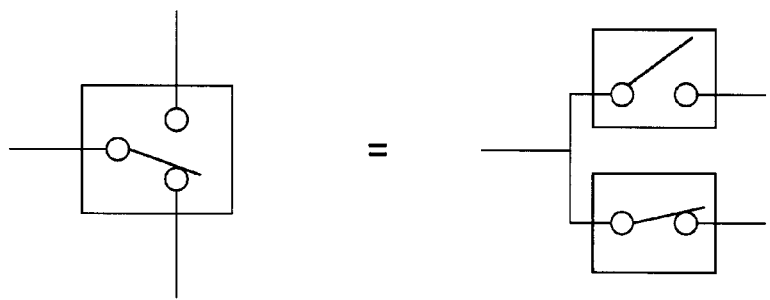
FIG. 8 shows an alternative high-frequency signal changeover switch according to a seventh embodiment of the invention.

In the first to sixth embodiments, the changeover switches are of a SPDT (single-pole double-throw) type. Alternatively, as shown in FIG. 8, a pair of SPST (single-pole single-throw) switches or a pair of simple on/off switches may naturally be used. This configuration may reduce the cost of parts used.

Embodiment 8

Figure 9A:
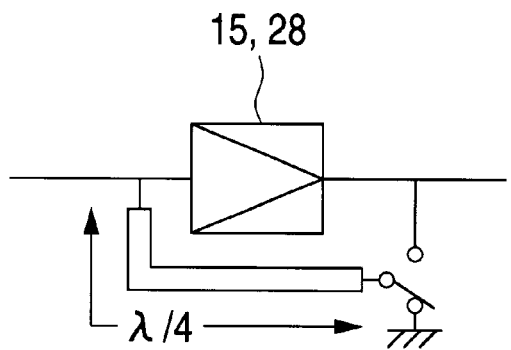
FIGS. 9A and 9B show an alternative combination of a bypass line and a high-frequency signal changeover switch according to an eighth embodiment of the invention.
Figure 9B:
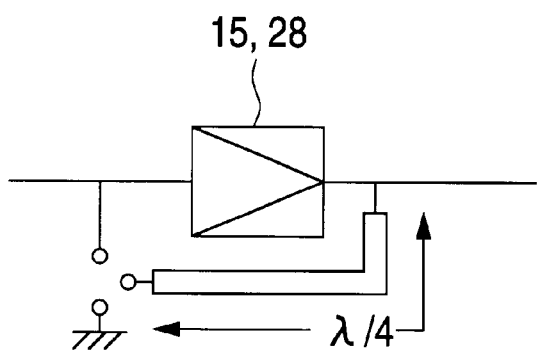

To reduce the number of switches to thereby make the configuration as simple as possible, a quarter-wavelength bypass line may be used as shown in FIGS. 9A and 9B. This embodiment is effective when the bandwidth used is narrow and hence the gain of the power amplifier 15 or 28 to be bypassed is not large. In this embodiment, non-reflective SPST switches may be used.

Figure 10A:
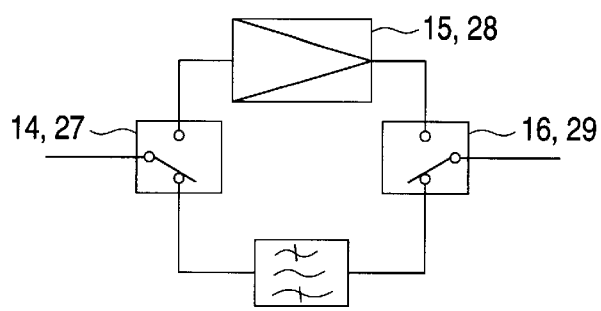
FIGS. 10A–10C show bandpass filters provided in the bypass line according to a ninth embodiment of the invention.
Figure 10B:
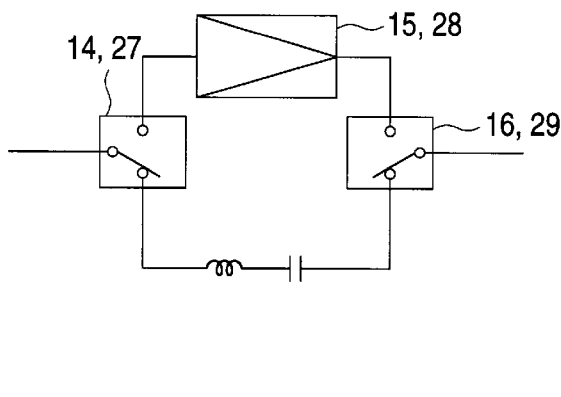
Figure 10C:
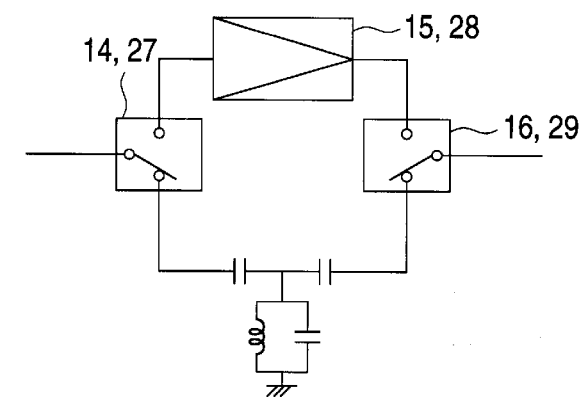

Embodiment 9

Where the gain of the power amplifier 15 or 28 to be bypassed is high and hence feedback-loop oscillation may occur at a high possibility, a simple bandpass filter may be provided in the bypass line as shown in FIGS. 10A–10C. In FIG. 10A, the bandpass filter is constituted by a single, independent part. In each of FIGS. 10B and 10C, the bandpass filter consists of general-purpose parts. These configurations improve the out-of-band isolation, so that the operation of the device becomes more stable, that is, the feedback-loop oscillation becomes less likely to occur. In addition, the simple configurations of FIGS. 10B and 10C enable cost reduction.

Embodiment 10

Figure 11:
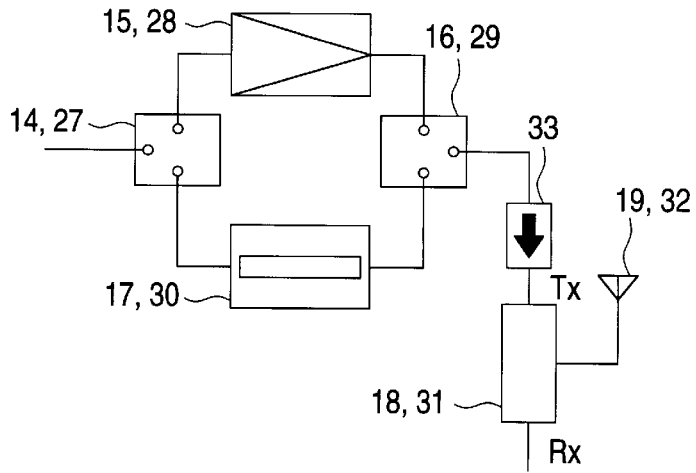
FIG. 11 shows part of a transmitter power varying device according to a tenth embodiment of the invention.
Figure 12:
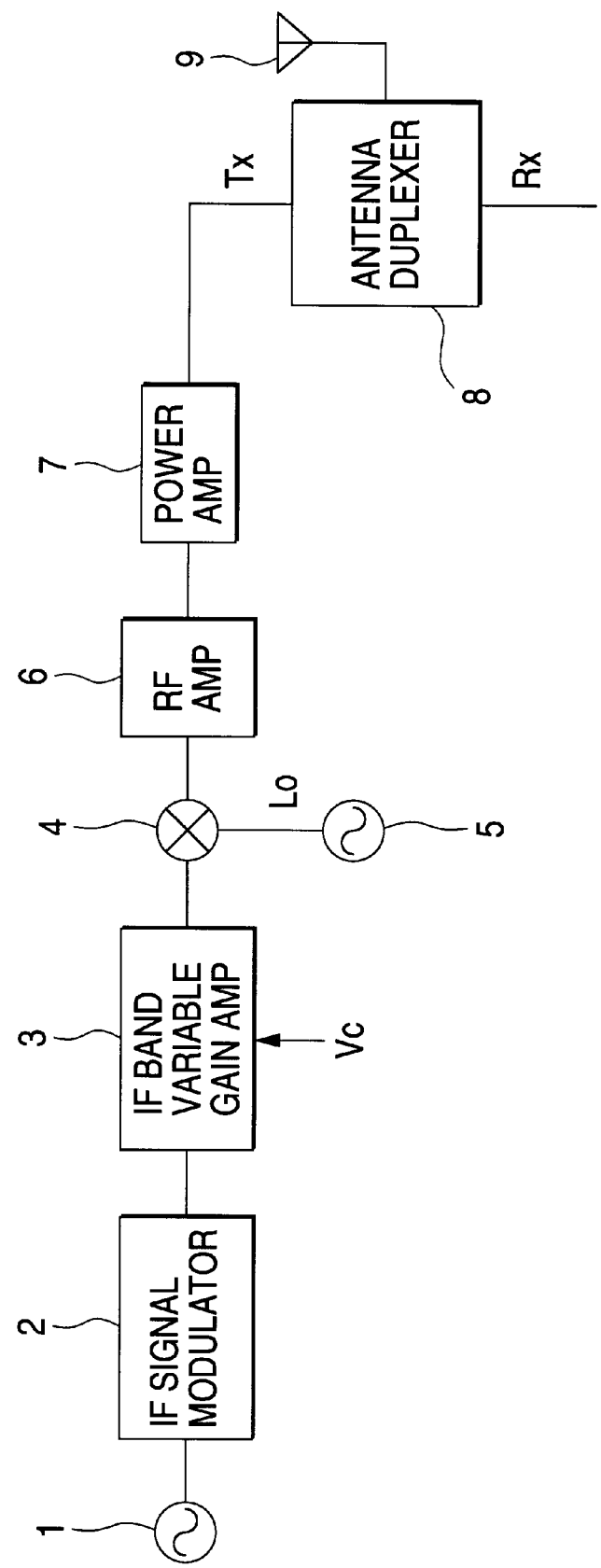
FIG. 12 is a block diagram showing a general configuration of a conventional transmitter power varying device.

An isolator 34 that is used conventionally is not described in the first to ninth embodiments. When it is used in the invention to improve the stability of the power amplifier 15 or 28 with respect to a load variation and to prevent transmitter IM (intermodulation), it is inserted upstream of a terminal $T_x$ of the antenna duplexer 31 as shown in FIG. 11. This is also effective in improving the stability with respect to a load variation of the previous-stage amplifier provided upstream of the power amplifier 15 or 28 in a state that switching is made to the bypass line 17 or 30.

What is claimed is:

1. A transmitter power varying device comprising:
    a variable gain amplifier for amplifying a transmission signal with a variable gain;
    a power amplifier for amplifying the transmission signal which is to be transmitted from an antenna;
    a bypass line provided parallel with the power amplifier; and
    first and second high-frequency signal changeover switches respectively provided upstream and downstream of the power amplifier and the bypass line, for causing the transmission signal to go through the bypass line while bypassing the power amplifier in response to an output power of the transmission signal being reduced below a first threshold value;
    wherein the gain of the variable gain amplifier is increased to compensate for a gain reduction due to bypassing of the power amplifier.

2. The transmitter power varying device according to claim 1, wherein the power amplifier is made off while it is bypassed.

3. The transmitter power varying device according to claim 1, wherein the first and second high-frequency signal changeover switches cause the transmission signal to go through the power amplifier in response to the output power of the transmission signal being increased above a second threshold value that is larger than the first threshold value, to provide a hysteretic output control characteristic.

4. The transmitter power varying device according to claim 1, further comprising an isolator that is provided in the bypass line.

5. The transmitter power varying device according to claim 1, further comprising a resistive attenuator that is provided in the bypass line.

6. The transmitter power varying device according to claim 4, further comprising a circulator that is connected to an output side of the isolator and to an output side of the power amplifier via the second high-frequency signal changeover switch, wherein the second high-frequency signal changeover switch is so constructed as to selectively connect the output side of the isolator to the output side of the power amplifier or a ground side via the circulator.

7. The transmitter power varying device according to claim 1, further comprising, upstream of the first high-frequency signal changeover switch, a cascade connection of a high-frequency signal oscillator, a modulator, and a variable gain amplifier.

8. The transmitter power varying device according to claim 1, further comprising, upstream of the first high-frequency signal changeover switch, a cascade connection of an IF signal oscillator, an IF signal modulator, an IF band variable gain amplifier, an up-converter mixer, and a RF amplifier.

9. The transmitter power varying device according to claim 1, further comprising upstream of the first high-frequency signal changeover switch, a cascade connection of an IF signal oscillator, an IF signal modulator, an IF band variable gain amplifier, an up-converter mixer, and a RF band variable gain amplifier.

10. The transmitter power varying device according to claim 1, wherein each of the first and second high-frequency signal changeover switches is a single-pole double-throw switch.

11. The transmitter power varying device according to claim 1, wherein each of the first and second high-frequency signal changeover switches is a pair of single-pole single-throw switches.

12. The transmitter power varying device according to claim 1, wherein each of the first and second high-frequency signal changeover switches is a pair of on/off switches.

13. The transmitter power varying device according to claim 1, further comprising a bandpass filter that is provided in the bypass line.

14. The transmitter power varying device according to claim 1, further comprising an isolator that is provided downstream of the second high-frequency signal changeover switch.

15. A transmitter power varying device comprising:
    a variable gain amplifier for amplifying a transmission signal with a variable gain;
    a power amplifier for amplifying the transmission signal which is to be transmitted from an antenna;
    a quarter-wavelength line provided parallel with the power amplifier; and
    a high-frequency signal changeover switch provided upstream or downstream of the power amplifier and the quarter-wavelength line, for causing the transmission signal to go through the quarter-wavelength line while bypassing the power amplifier in response to an output power of the transmission signal being reduced below a threshold value;
    wherein the gain of the variable gain amplifier is increased to compensate for a gain reduction due to bypassing of the power amplifier.

16. A transmitter power varying device comprising:
    a variable gain amplifier for amplifying a transmission signal with a variable gain;
    a power amplifier for amplifying the transmission signal which is to be transmitted from an antenna;
    a bypass line provided parallel with the power amplifier;
    first and second high-frequency signal changeover switches respectively provided upstream and downstream of the power amplifier and the bypass line, for causing the transmission signal to go through the bypass line while bypassing the power amplifier, reducing a power of the transmission signal below a first threshold value;
    an isolator provided in the bypass line; and
    a circulator that is connected to an output side of the isolator and to an output side of the power amplifier via the second high-frequency signal changeover switch, wherein the second high-frequency signal changeover switch is so constructed as to selectively connect the output side of the isolator to the output side of the power amplifier or a ground side via the circulator;
    wherein the gain of the variable gain amplifier is increased to compensate for a gain reduction due to bypassing of the power amplifier.

* * * * *